United States Patent
Gardner et al.

[11] Patent Number: 6,069,046
[45] Date of Patent: May 30, 2000

[54] TRANSISTOR FABRICATION EMPLOYING IMPLANTATION OF DOPANT INTO JUNCTIONS WITHOUT SUBJECTING SIDEWALL SURFACES OF A GATE CONDUCTOR TO ION BOMBARDMENT

[75] Inventors: Mark I. Gardner, Cedar Creek; Daniel Kadosh; Michael P. Duane, both of Austin, all of Tex.

[73] Assignee: Advanced Micro Devices, Inc., Sunnyvale, Calif.

[21] Appl. No.: 08/979,282

[22] Filed: Nov. 26, 1997

[51] Int. Cl.[7] .................................................. H01L 21/336
[52] U.S. Cl. ........................................ 438/305; 438/307
[58] Field of Search ..................................... 438/307, 303, 438/305, 948

[56] References Cited

U.S. PATENT DOCUMENTS

| | | |
|---|---|---|
| 3,997,367 | 12/1976 | Yau . |
| 4,601,779 | 7/1986 | Abernathey et al. . |
| 4,663,827 | 5/1987 | Nakahara . |
| 4,774,197 | 9/1988 | Haddad et al. . |
| 4,837,180 | 6/1989 | Chao . |
| 5,272,100 | 12/1993 | Satoh et al. . |
| 5,431,770 | 7/1995 | Lee et al. . |
| 5,567,638 | 10/1996 | Lin et al. . |
| 5,604,138 | 2/1997 | Lee et al. . |
| 5,753,557 | 5/1998 | Tseng .................................. 438/303 |
| 5,789,300 | 8/1998 | Fulford, Jr. .......................... 438/301 |
| 5,869,378 | 2/1999 | Michael ............................... 438/305 |

*Primary Examiner*—Richard Booth
*Attorney, Agent, or Firm*—Kevin L. Daffer; Conley, Rose & Tayon

[57] ABSTRACT

A process is provided for fabricating a transistor in which ion implantation of dopant into source/drain junctions is performed prior to defining the sidewall surfaces of a gate conductor. As such, the sidewall surfaces of the gate conductor are not subjected to damaging bombardment by ions. In one embodiment, a masking layer is patterned above a polysilicon layer dielectrically spaced above a semiconductor substrate. A S/D implant self-aligned to the sidewall surfaces of the masking layer is performed. Portions of the masking layer are removed to reduce the width of the masking layer and to form more closely spaced sidewalls. An LDD implant self-aligned to the new sidewalls of the masking layer is performed. Thereafter, the polysilicon layer is etched to define a gate conductor above and between LDD areas disposed within the substrate. In another embodiment, a sacrificial layer is patterned above a polysilicon layer dielectrically spaced above a semiconductor substrate. A S/D implant self-aligned to the sidewall surfaces of the sacrificial layer and an LDD implant self-aligned to exposed lateral edges of sidewall spacers arranged upon the sidewall surfaces of the sacrificial layer are performed. The polysilicon layer is then etched to define a gate conductor above and between LDD areas arranged within the substrate.

8 Claims, 10 Drawing Sheets

TRANSISTOR FABRICATION EMPLOYING IMPLANTATION OF DOPANT INTO JUNCTIONS WITHOUT SUBJECTING SIDEWALL SURFACES OF A GATE CONDUCTOR TO ION BOMBARDMENT

BACKGROUND OF THE INVENTION

1. Field of the Invention

This invention relates to integrated circuit fabrication and, more particularly, to forming a transistor without defining the sidewall surfaces of the gate conductor prior to implantation of dopant into the transistor junctions.

2. Description of the Relevant Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source/drain regions within the substrate adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single monolithic substrate.

FIGS. 1–4 illustrate the fabrication of a conventional transistor. A semiconductor substrate 10 is provided upon which a gate oxide 12 has been thermally grown. A polysilicon layer 14 has been deposited across gate oxide 12 using chemical-vapor deposition ("CVD"). Portions of polysilicon layer 14 and gate oxide 12 are removed to define a gate conductor 18 dielectrically spaced above substrate 10, as shown in FIG. 2. A lightly doped drain ("LDD") implant self-aligned to the opposed sidewall surfaces of gate conductor 18 is then forwarded into substrate 10 to form LDD areas 20 on opposite sides of the gate conductor. Thereafter, a dielectric material 22, e.g., silicon dioxide ("oxide") is deposited across gate conductor 18 and substrate 10. The dielectric material 22 is then removed from horizontally oriented surfaces while being retained upon the sidewall surfaces of gate conductor 18 using an anisotropic etch technique, thereby forming sidewall spacers 24. A source/drain ("S/D") implant self-aligned to the exposed lateral edges of sidewall spacers 24 is forwarded into substrate 10 to form source/drain regions 26. The S/D implant species are implanted at a higher dose and higher energy than those implanted into LDD areas 20. As a result, the peak concentration of dopant species within source/drain regions 26 is greater than that of the more shallow LDD areas 20.

The combination of LDD areas 20 and source/drain regions 26 form source-side and drain-side graded junctions on opposite sides of the resulting transistor. The LDD areas 20 can absorb some of the potential at the interface between the channel and the junctions. Unfortunately, during ion implantation of dopant into source/drain regions 26 and LDD areas 20, ions may impinge the lateral edges of gate conductor 18 and sidewall spacers 24. The ions lose their energy in a series of nuclear and electronic collisions and come to rest in close proximity to lateral edges of gate conductor 18 and sidewall spacers 24. As a result, more dopant species accumulate near the lateral edges of gate conductor 18 than in other portions of the gate conductor. During subsequent anneal steps, these dopant species may deleteriously migrate into the underlying channel region, and thereby increase potential gradients in the device. The maximum electric field, Em, occurring near the drain-side junction during saturated operation of the transistor may consequently be increased, despite the presence of LDD areas 20. The existence of an electric field at the drain of an operating transistor primarily causes electrons in the channel to gain kinetic energy and become "hot", leading to a phenomenon known as hot-carrier effect ("HCE"). As hot electrons travel to the drain, they lose their energy by a process called impact ionization. Impact ionization serves to generate electron-hole pairs, wherein the pairs migrate to and become injected within the gate dielectric near the drain-side junction. Traps within the gate dielectric generally become electron traps, even if they are partially filled with holes. As a result, there is a net negative charge density in the gate dielectric. The trapped charge can accumulate with time, resulting in a positive threshold shift in an NMOS transistor, or a negative threshold shift in a PMOS transistor. Since hot electrons are more mobile than hot holes, HCE causes a greater threshold skew in NMOS transistors than PMOS transistors.

The nuclear collisions of energetic ions with atoms within polysilicon gate conductor 18 and oxide-based sidewall spacers 24 may cause damage at the lateral edges of these structure. Various defects may form near the edges of gate conductor 18 and sidewall spacers 24. The energetic ions may dislodge atoms from their original positions, resulting in the formation of vacancies and dangling bonds within gate conductor 18 and sidewall spacers 24. Unfortunately, such vacancies and dangling bonds may serve as traps to foreign atoms, e.g., hydrogen, and hot electrons. Hydrogen atoms thus may form weak Si-H bonds at the gate conductor/gate dielectric interface. These bonds can be easily broken by injected hot electrons. The presence of foreign atoms within gate conductor 18 and sidewall spacers 24 can alter the properties of these structures in a detrimental manner. For instance, the presence of foreign atoms within gate conductor 18 may cause the resistivity of the gate conductor edge to increase, and thereby lead to a shift in the threshold voltage, $V_T$, from its desired value.

It would therefore be desirable to develop a transistor fabrication technique in which problems associated with ion bombardment of the lateral edges of the transistor gate conductor and sidewall spacers are alleviated. More specifically, a process is needed in which ions are prevented from striking the lateral edges of the gate conductor and the sidewall spacers during implantation of dopant into transistor junctions. As such, dopant species would no longer be allowed to accumulate more so near the edges of the gate conductor than other regions of the gate conductor. Thus, less dopant species would be available in the gate conductor to migrate to the lateral junction at the drain adjacent the channel and thereby result in an undesirable increase in Em. Moreover, damage incurred by collisions between energetic ions and atoms within the gate conductor and sidewall spacers would be prevented. Accordingly, foreign atoms and hot electrons would be less likely to become trapped in the gate conductor and sidewall spacers. Problems associated with HCE would be less probable.

SUMMARY OF THE INVENTION

The problems outlined above are in large part solved by the technique hereof for fabricating a transistor in which ion implantation of dopant into source/drain junctions is performed prior to defining the sidewall surfaces of a gate conductor. As such, the sidewall surfaces of the gate conductor are not subjected to damaging bombardment by ions. Thus, the concentration of dopant does not significantly vary laterally across the resulting gate conductor because all dopant species initially strike the upper surface of the gate conductor. Consequently, no additional dopant species are available at the gate conductor edges to migrate to a region of the channel immediately adjacent the drain of the transistor where they could otherwise lead to an increase in the electric field Em. Furthermore, energetic ions are not permitted to strike and dislodge silicon atoms at edges of the gate conductor. As a result, it is believed that less dangling bonds and vacancies are formed at the gate conductor edges to trap undesirable foreign atoms and hot carriers. The resulting transistor is advantageously more resistant to HCE, and the threshold voltage of the transistor can be properly maintained at its design specification.

One embodiment of the present invention contemplates aligning the S/D and LDD implants to the sidewalls of a masking layer before and after the masking layer is subjected to an isotropic etch, respectively. The masking layer may be composed of photoresist which is optically patterned either upon a polysilicon layer dielectrically spaced above a semiconductor substrate or upon a sacrificial layer arranged upon a polysilicon layer above a substrate. The sacrificial layer consists of a material substantially dissimilar from polysilicon to permit its removal while retaining the polysilicon layer. The sacrificial layer preferably comprises nitride arranged upon oxide. The nitride may serve to prevent encroachment of ambient oxygen to the surface of the polysilicon layer so as to inhibit oxidation of the polysilicon layer while the layer is being annealed. The S/D implant is self-aligned to the sidewalls of the patterned masking layer, followed by removal of portions of the masking layer to reduce its lateral width (i.e., distance between opposed sidewalls of the masking layer). Thereafter, the LDD implant is self-aligned to the new, more closely spaced sidewalls of the masking layer. Portions of the sacrificial layer and the polysilicon layer not protected by the masking layer may then be etched to define the sidewall surfaces of a gate conductor upon which a sacrificial layer exists. Alternately, the masking layer and sacrificial layer may be stripped prior to defining the sidewalls surfaces of the gate conductor. Sidewall spacers may be formed upon exposed surfaces of the gate conductor, and metal silicide may be formed upon the source/drain regions and/or the gate conductor surface.

An alternate embodiment of the invention involves forming a transistor in which the S/D implant is self-aligned to opposed sidewall surfaces of a sacrificial layer and the LDD implant is self-aligned to exposed lateral edges of sidewall spacers formed upon those sidewall surfaces. The sacrificial layer is arranged above a polysilicon layer which is dielectrically spaced above a semiconductor substrate. The S/D and LDD implants are performed prior to defining the sidewall surfaces of a gate conductor formed from the polysilicon layer. The sacrificial layer may be composed of various materials, such as polysilicon, nitride, metal, or oxynitride. Dopant species may be introduced into the LDD areas of the substrate using an LDD implant prior to formation of sidewall spacers upon the opposed sidewall surfaces of the patterned sacrificial layer. The sidewall spacers may then be formed, and a S/D implant may be subsequently performed to introduce dopant species into source/drain regions of the substrate. Alternately, sidewall spacers may be formed upon the opposed sidewall surfaces of the gate conductor first, permitting the S/D implant to be performed before the LDD implant. The sidewall spacers are removed prior to the LDD implant.

BRIEF DESCRIPTION OF THE DRAWINGS

Other objects and advantages of the invention will become apparent upon reading the following detailed description and upon reference to the accompanying drawings in which:

FIG. 12a is a cross-sectional view of the semiconductor topography, wherein portions of the polysilicon layer are removed to define the sidewall surfaces of gate conductors which are laterally spaced apart above the substrate, subsequent to the step in FIG. 11a;

FIG. 13a is a cross-sectional view of the semiconductor topography, wherein an oxide is thermally grown upon the upper surfaces and opposed sidewall surfaces of the gate conductors, subsequent to the step in FIG. 12a;

FIG. 23a is a cross-sectional view of the semiconductor topography, wherein a S/D implant self-aligned to the exposed lateral surfaces of the sidewall spacers is performed, subsequent to the step in FIG. 22a;

FIG. 24a is a cross-sectional view of the semiconductor topography, wherein the sidewall spacers are removed from the sidewall surfaces of the sacrificial structures and an LDD implant self-aligned to the sidewall surfaces of the sacrificial structures is performed, subsequent to the step in FIG. 23a;

DETAILED DESCRIPTION OF THE INVENTION

Figure 1:
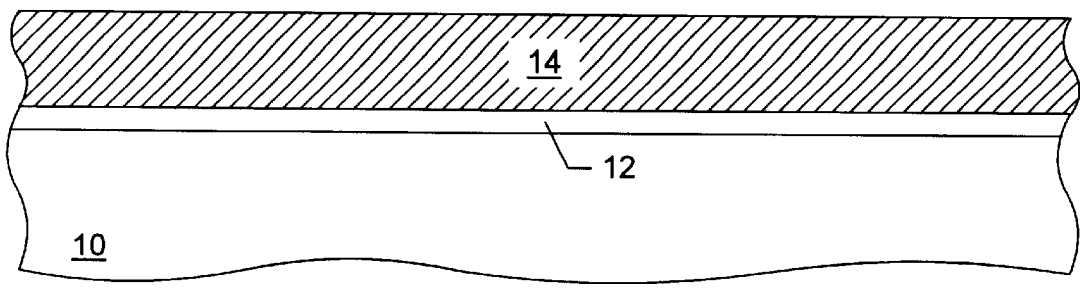
FIG. 1 is a cross-sectional view of a semiconductor topography, wherein a polysilicon layer is formed upon a gate oxide arranged above a semiconductor substrate, according to conventional design.
Figure 2:
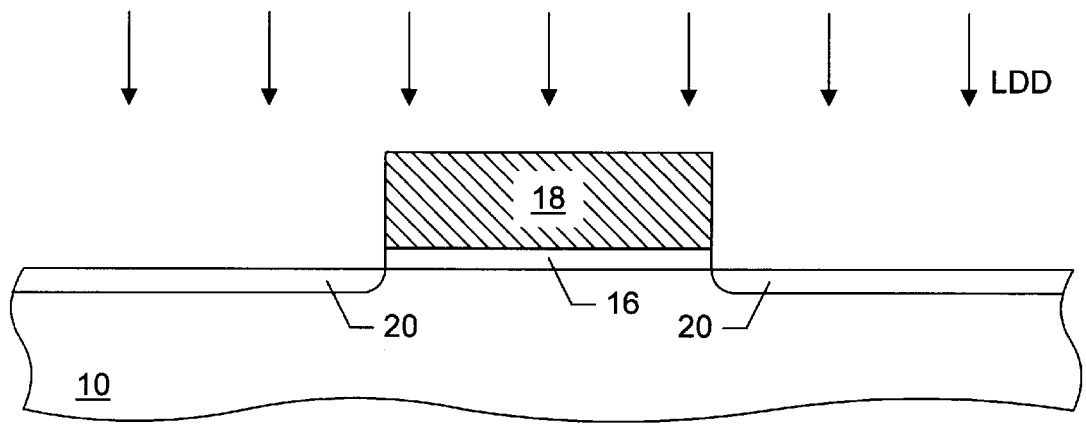
FIG. 2 is a cross-sectional view of the semiconductor topography, wherein portions of the polysilicon layer and the gate oxide are removed to define a gate conductor and an LDD implant is forwarded into the substrate, subsequent to the step in FIG. 1.
Figure 3:
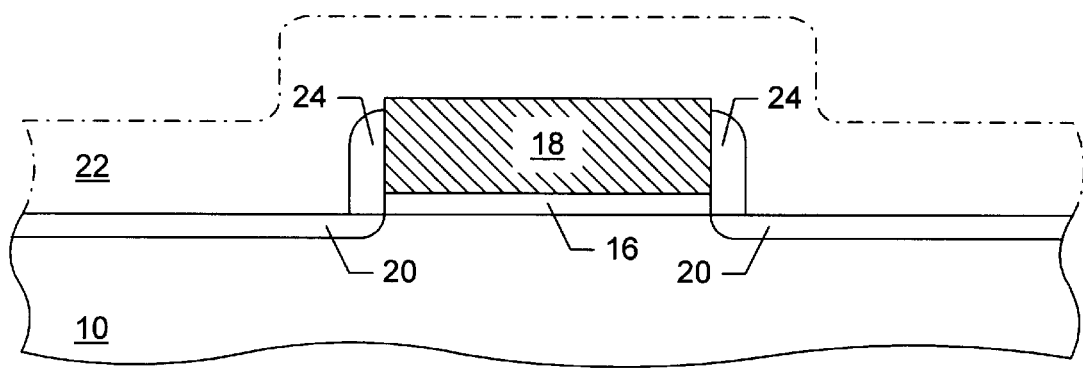
FIG. 3 is a cross-sectional view of the semiconductor topography, wherein sidewall spacers are formed upon opposed sidewall surfaces of the gate conductor, subsequent to the step in FIG. 2.
Figure 4:
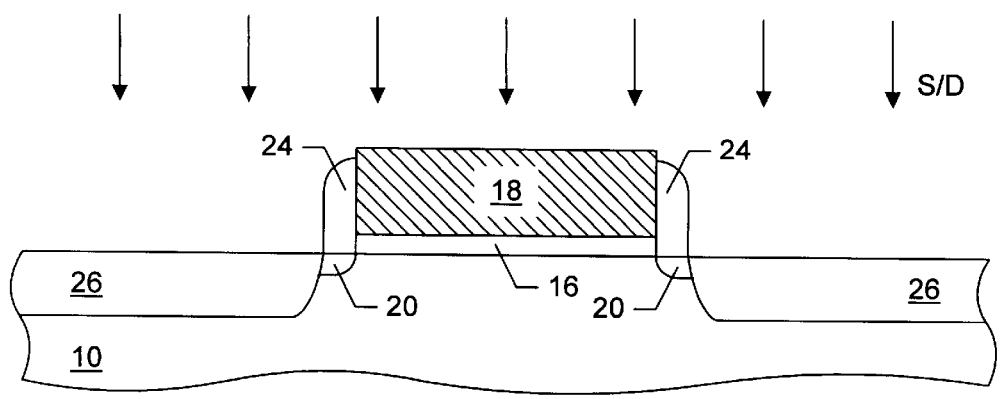
FIG. 4 is a cross-sectional view of the semiconductor topography, wherein a S/D implant self-aligned to the exposed lateral edges of the sidewall spacers is forwarded into the substrate, subsequent to the step in FIG. 3.
Figure 5:
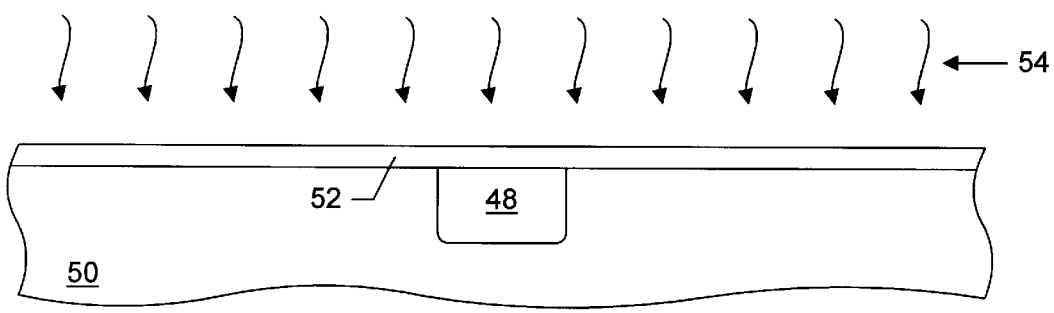
FIG. 5 is a cross-sectional view of a semiconductor topography, wherein a gate oxide is thermally grown upon a semiconductor substrate, according to one embodiment of the present invention.
Figure 6:
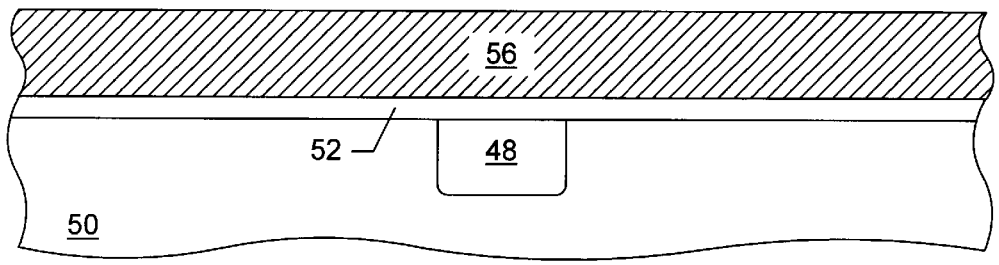
FIG. 6 is a cross-sectional view of the semiconductor topography, wherein a polysilicon layer is deposited across the gate oxide, subsequent to the step in FIG. 5.

FIGS. 5–16 illustrate one embodiment of the present invention. Turning to FIG. 5, a partial cross-sectional view of a semiconductor substrate 50 is depicted. Substrate 50 comprises single crystalline silicon and dielectric isolation regions, such as shallow trench isolation structure 48, arranged spaced distances apart for dielectrically isolating ensuing active areas. The dielectric isolation regions may alternately include well known LOCOS structures. Substrate 50 is slightly doped with n-type or p-type impurities. A gate dielectric 52 may be formed by subjecting silicon-based substrate 50 to thermal radiation 54 in an oxygen bearing ambient. As such, gate dielectric 52 may be a thermally grown oxide. FIG. 6 depicts the chemical-vapor deposition ("CVD") of a polysilicon layer 56 across gate dielectric 52. Polysilicon layer 56 may be deposited from, e.g., a silane source.

Figure 7:
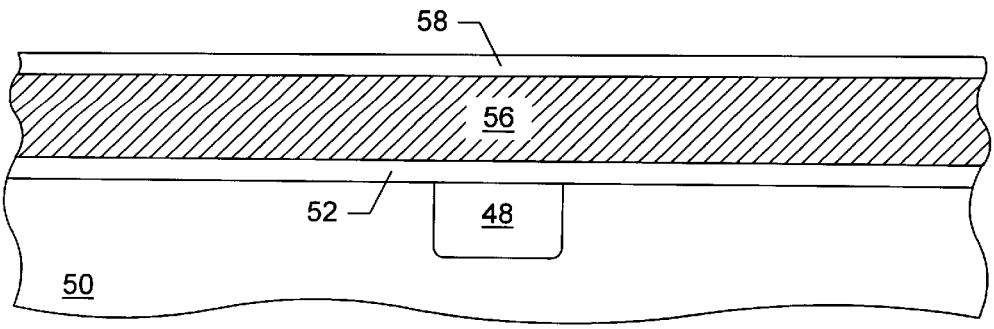
FIG. 7 is a cross-sectional view of the semiconductor topography, wherein an oxide layer is formed across the polysilicon layer, subsequent to the step in FIG. 6.
Figure 8:
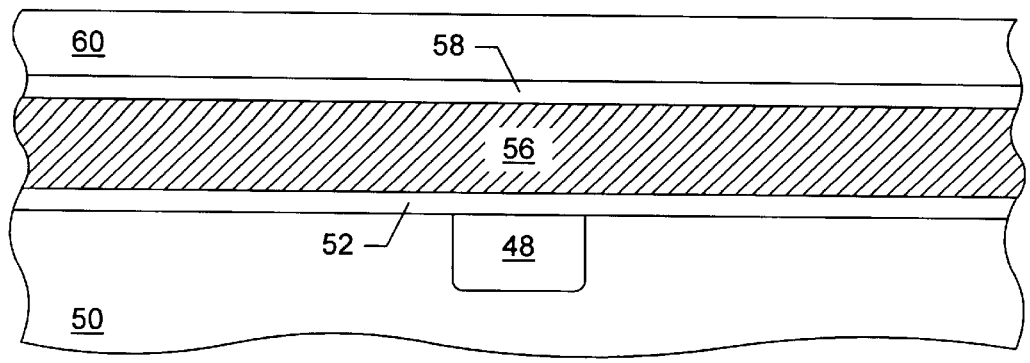
FIG. 8 is a cross-sectional view of the semiconductor topography, wherein a nitride layer is formed across the oxide layer, subsequent to the step in FIG. 7.

As shown in FIG. 7, an oxide layer 58 may be deposited across polysilicon layer 56 using CVD from, e.g., a silane and oxygen bearing source. Alternately, oxide layer 58 may be thermally grown upon polysilicon layer 56. A nitride layer 60 may then be deposited across oxide layer 58 using CVD from, e.g., a silane and ammonia bearing source. The combination of oxide layer 58 and nitride layer 60 forms a sacrificial layer which is to be removed in a later processing step after it has served its purpose. In an alternate embodiment, the sacrificial layer may include any material dissimilar to polysilicon (e.g., a single layer of nitride, metal, or oxynitride), allowing it to be selectively etched without substantial removal of polysilicon layer 56. In yet another embodiment, the sacrificial layer may not exist.

Figure 9:
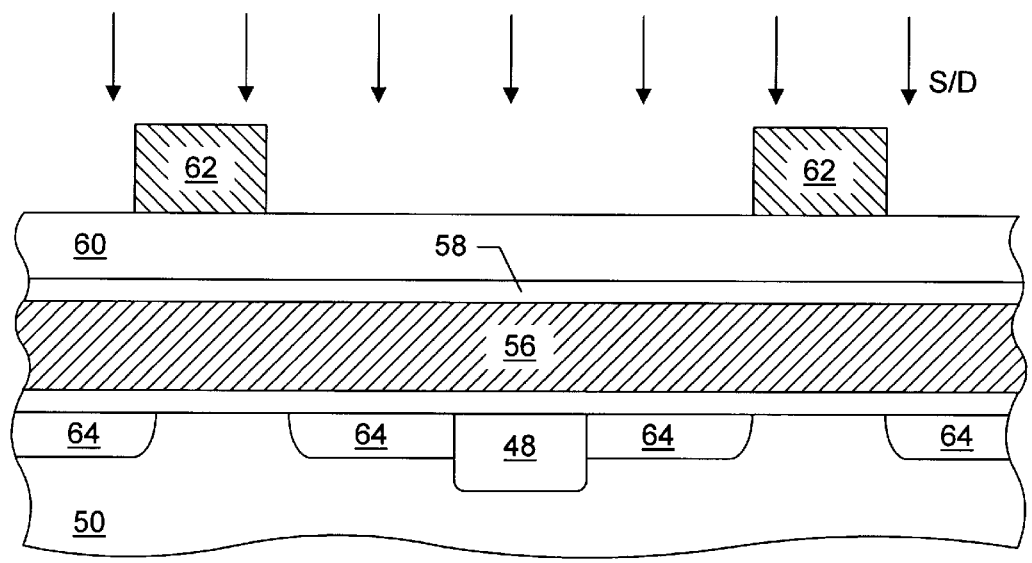
FIG. 9 is a cross-sectional view of the semiconductor topography, wherein a photoresist masking layer is patterned upon the nitride layer and a S/D implant selfaligned to the sidewalls of the masking layer is performed, subsequent to the step in FIG. 8.

Turning to FIG. 9, a masking layer 62 is patterned across nitride layer 60. In the instance that oxide layer 58 and nitride layer 60 are not present, masking layer 62 may be arranged upon polysilicon layer 56. Masking layer 62 may be composed of photoresist patterned using optical lithography. A source/drain implant self-aligned to the sidewalls of masking layer 62 is then forwarded into substrate 50 at a relatively high dose to form source/drain regions 64. A relatively high implant energy in the MeV range may be used for the S/D implant to ensure that dopant species pass entirely through unmasked regions of the various layers arranged above substrate 64. Portions of polysilicon layer 56 arranged directly below masking layer 62 are also implanted with impurities at this time, providing ensuing gate conductors with dopant species. Isolation structure 48 isolates source/drain regions 64 which are to belong to different ensuing transistors such that those source/drain regions are prevented from electrically communicating with each other. The dopant species used for the S/D implant are opposite in type from those within the bulk of substrate 50. If a PMOS integrated circuit is being formed, ion implantation of p-type species is performed, and if an NMOS integrated circuit is being formed, n-type species are implanted into substrate 50. Optionally, a CMOS integrated circuit containing both PMOSFET and NMOSFET devices may be formed. Formation of a CMOS circuit involves masking the active areas (i.e., those areas between isolation regions) of substrate 50 which are to contain one type of dopant species while implanting the other type of dopant species into unmasked active areas, followed by the opposite procedure. Some commonly used n-type dopants are arsenic or phosphorus, and some commonly used p-type dopants are boron or boron difluoride. A post-implant anneal may be performed to activate and position the as-implanted impurities.

Figure 10:
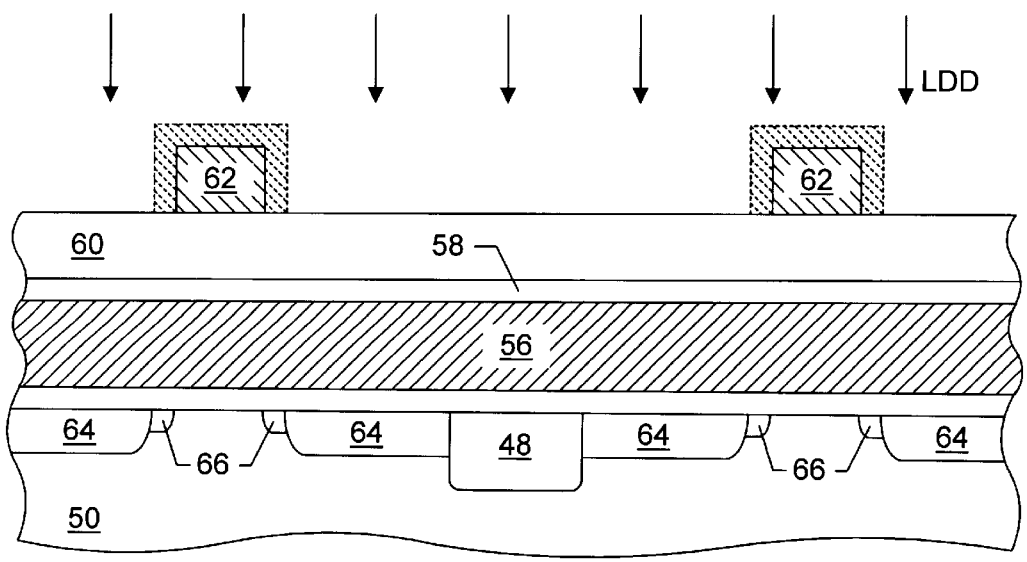
FIG. 10 is a cross-sectional view of the semiconductor topography, wherein the masking layer is etched to reduce its width and an LDD implant self-aligned to the resulting, more closely spaced sidewalls of the masking layer is performed, subsequent to the step in FIG. 9.

Turning to FIG. 10, masking layer 62 is subjected to an isotropic etch technique which occurs at the same rate in all directions. In this manner, the width of each structure of masking layer 62 is decreased, and more closely spaced sidewalls are defined for the masking layer. An LDD implant self-aligned to those sidewalls of masking layer 62 is then forwarded into substrate 50 to form LDD areas 66 laterally adjacent source/drain regions 66. The LDD areas 66 preferably contain a light concentration of dopant species that are of the same type as those implanted within source/drain regions 64. While the implant energy used for the LDD implant is sufficient to incorporate dopant species into substrate 50, it may also be less than the previous S/D implant. As such, LDD areas 66 extend to a shallower depth than do source/drain regions 64. A post-implant anneal at a temperature lower than the temperature used for the post-S/D implant anneal may be performed.

Figure 11A:
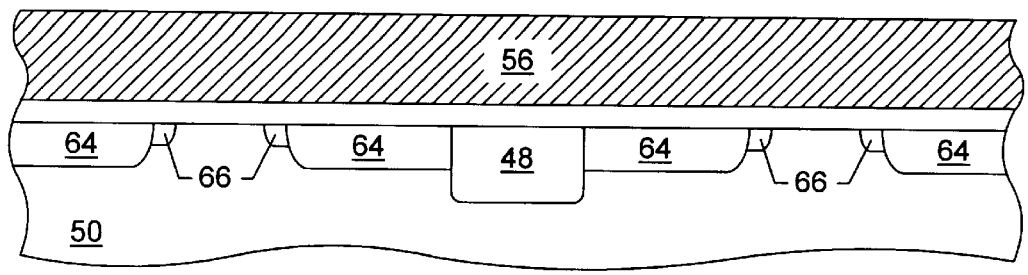
FIG. 11a is a cross-sectional view of the semiconductor topography, wherein the masking layer, nitride layer, and oxide layer are removed from above the polysilicon layer, subsequent to the step in FIG. 10.
Figure 11B:
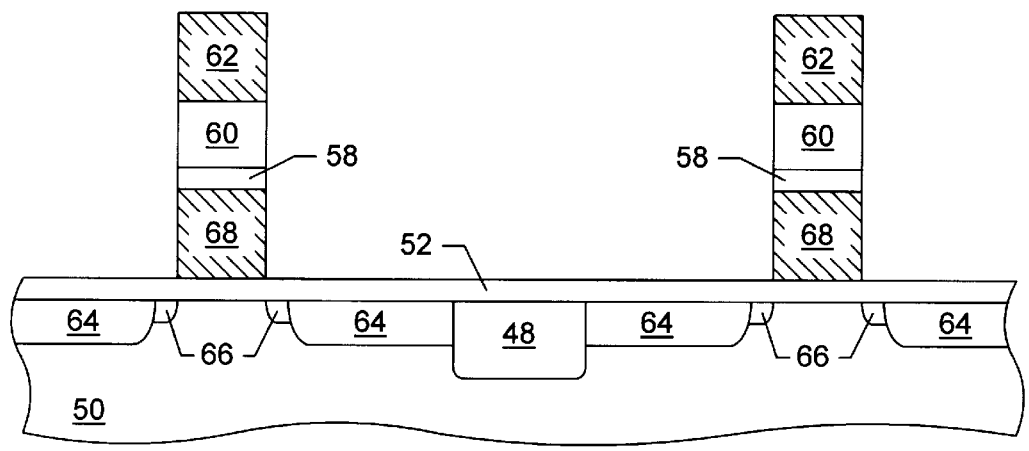
FIG. 11b is a cross-sectional view of the semiconductor topography, wherein portions of the masking layer, nitride layer, and oxide layer not protected by the masking layer are removed to define gate conductors, subsequent to the step in FIG. 10.

FIG. 11a illustrates the removal of masking layer 62, nitride layer 60, and oxide layer 58 from above polysilicon layer 56. Those layers may be removed using, e.g., a dry, plasma etch in which the etch duration is selected to terminate before substantial portions of polysilicon layer 56 have been removed. FIG. 11b depicts an alternate processing step to the one shown in FIG. 11a. Portions of nitride layer 60, oxide layer 58, and polysilicon layer 56 not protected by masking layer 62 are subjected to an etch technique, e.g., a plasma etch in which masking layer 62 is resistant to attack. Etch duration may be terminated after the upper surface of gate dielectric 52 is exposed. Optionally, portions of gate dielectric 52 not arranged directly below masking layer 62 may also be etched from above substrate 50. In this manner, doped polysilicon gate conductors 68 are defined a spaced distance apart upon gate dielectric 52. An oxide layer 58 and a nitride layer 60 are arranged above each of the gate conductors 68.

Figure 12A:
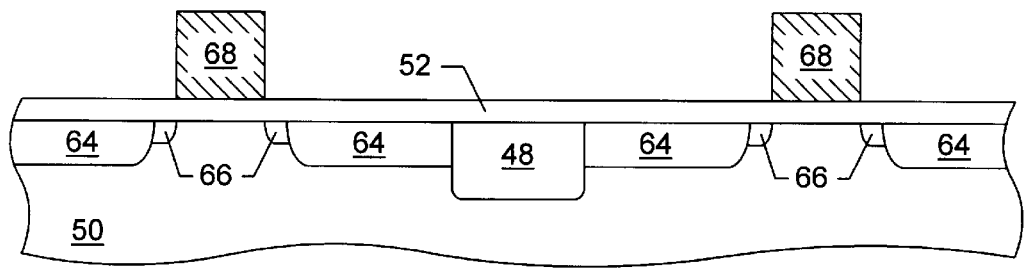
Figure 12B:
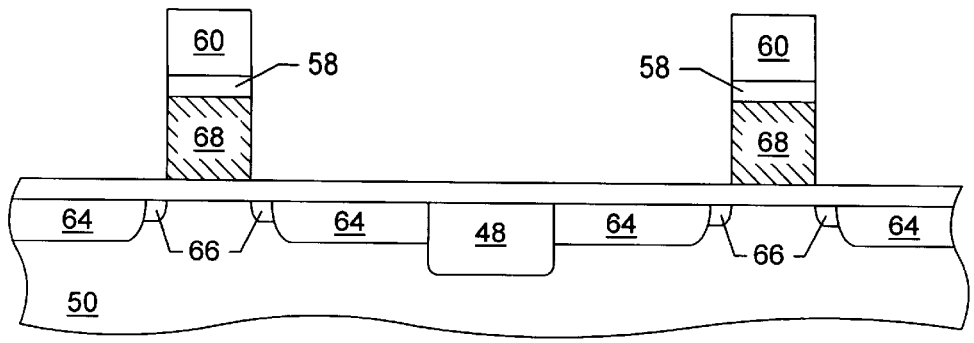
FIG. 12b is a cross-sectional view of the semiconductor topography, wherein the masking layer is removed from above the nitride layer, subsequent to the step in FIG. 11b.

FIG. 12a illustrates the formation of laterally spaced apart gate conductors 68 upon gate dielectric 52, subsequent to the step in FIG. 11a. Gate conductors 68 may be formed by patterning a photoresist layer across polysilicon layer 56 which exposes portions of the polysilicon layer to be etched, and thereafter subjecting the polysilicon layer to a plasma etch. As shown in both FIGS. 11b and 12a gate conductors 68 are arranged between LDD areas 66 above ensuing channel regions of substrate 50. FIG. 12b depicts gate conductors 68, oxide layer 58, and nitride layer 60 after the removal of masking layer 62 using, e.g., a plasma etch technique, following the step in FIG. 11b.

Figure 13A:
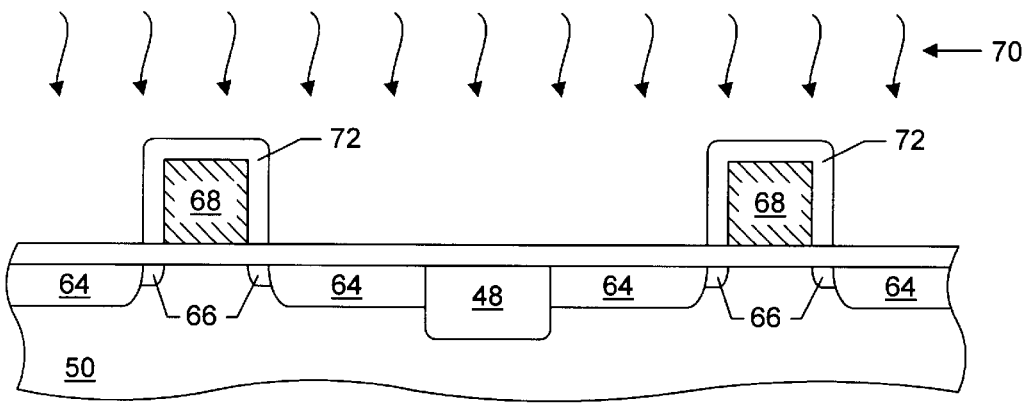
Figure 13B:
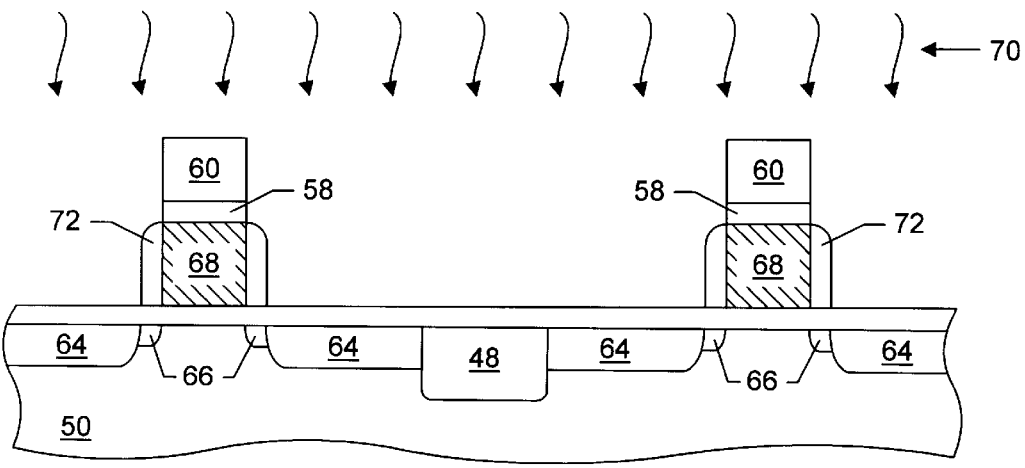
FIG. 13b is a cross-sectional view of the semiconductor topography, wherein an oxide is thermally grown upon the opposed sidewall surfaces of the gate conductors, subsequent to the step in FIG. 12b.

Turning to FIG. 13a, an oxide 72 is formed upon the exposed surfaces of gate conductors 68 by subjecting the gate conductors to thermal radiation 70 in the presence of an oxygen bearing ambient, subsequent to the step in FIG. 12a. As a result, gate conductors 68 are completely encapsulated by oxide. Oxide 72 may serve in one aspect as a diffusion barrier to prevent migration of impurities out of gate conductors 68. Oxide 72 may also serve to inhibit silicide from forming upon the surfaces of gate conductors 68 while silicide is being formed upon source/drain regions 64. FIG. 13b also depicts the formation of oxide spacers 72 upon the opposed sidewall surfaces of gate conductors 68, subsequent to the step in FIG. 12b. Oxide spacers 72 are thermally grown by exposing gate conductors 68 to thermal radiation 70 in the presence of an oxygen bearing ambient. Nitride 60 inhibits ambient oxygen from contacting the upper surfaces of gate conductors 68. Alternately, oxide spacers 72 may be formed by CVD depositing oxide across topological features and etching away portions of the oxide.

Figure 14:
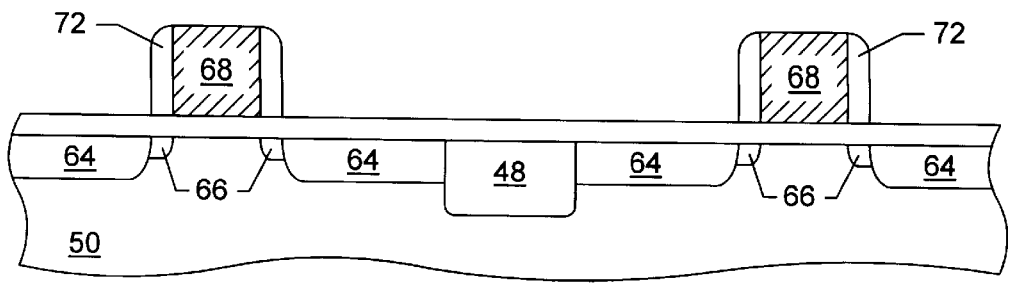
FIG. 14 is a cross-sectional view of the semiconductor topography, wherein the nitride layer and oxide layer are removed from the upper surfaces of the gate conductors, subsequent to the step in FIG. 13b.

As shown in FIG. 14, nitride layer 60 and oxide layer 58 may be removed from above gate conductors 68, subsequent to the step in FIG. 13b. Portions of oxide spacers 72 arranged above gate conductors 68 may also be removed such that their peaks are substantially coplanar with the upper surfaces of the gate conductors. A masking layer may be patterned above exposed surfaces of gate dielectric 52 prior to etching nitride layer 60, oxide layer 58, and oxide spacers 72. In one instance, an isotropic etch which exhibits high selectivity to oxide and nitride relative to polysilicon may be used to ensure that substantial portions of gate conductors 68 are not removed. The etch may be terminated after spacers 72 have been removed down to a level approximately commensurate with the upper surfaces of gate conductors 68.

Figure 15:
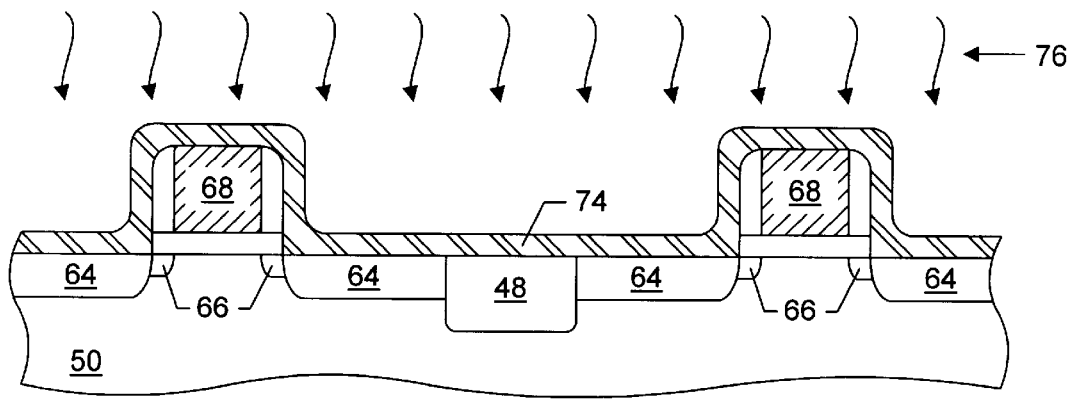
FIG. 15 is a cross-sectional view of the semiconductor topography, wherein a refractory metal is deposited across exposed topological surfaces and then heated, subsequent to the step in FIG. 14.
Figure 16:
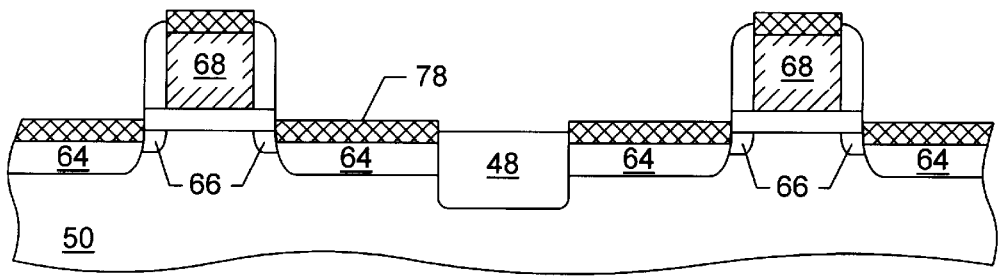
FIG. 16 is a cross-sectional view of the semiconductor topography, wherein metal silicide is formed upon the upper surfaces of the gate conductors and the source/drain regions, subsequent to the step in FIG. 15.

Turning to FIG. 15, portions of gate dielectric 52 are removed using, e.g., a plasma etch to expose source/drain regions 64 and isolation region 48. A refractory metal 74, e.g., titanium or cobalt, may be formed across the exposed surfaces of the semiconductor topography. Refractory metal 74 may be sputter deposited from a metal target or MOCVD (metal organic CVD) deposited from a metal organic source. The deposited refractory metal 74 is exposed to a heat cycle 76. Refractory metal 74 may be heated using thermal radiation supplied from a furnace or rapid thermal processing ("RTP") in which radiant light is supplied from, e.g., an arc lamp or a tungsten-halogen lamp. The use of RTP to heat refractory metal 74 may reduce the amount of unwanted dopant diffusion into the semiconductor topography as compared to using a high temperature furnace. Raising the temperature of refractory metal 74 serves to initiate reaction between metal atoms and underlying silicon atoms of polysilicon gate conductors 68 and substrate 50. Any unreacted refractory metal which remains may be etched away using, e.g., an isotropic etch highly selective to the metal. As shown in FIG. 16, a metal silicide 78 results which has a relatively low resistivity and serves as a self-aligned contact region across source/drain regions 64 and gate conductors 68.

Figure 17:
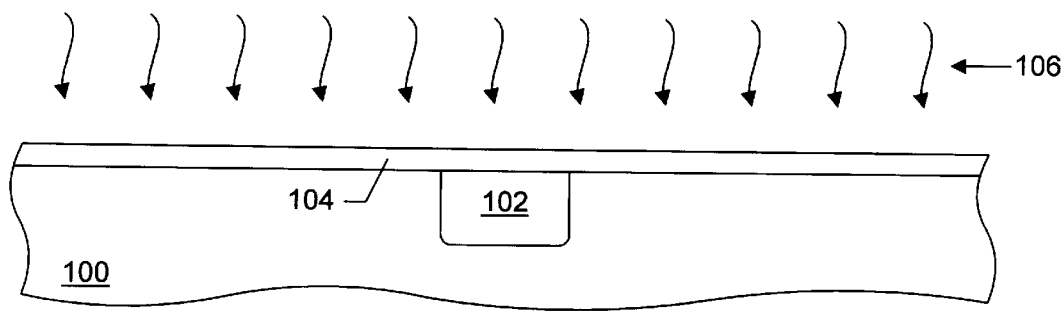
FIG. 17 is a cross-sectional view of the semiconductor topography, wherein a gate oxide is thermally grown upon a semiconductor substrate, according to another embodiment of the present invention.
Figure 18:
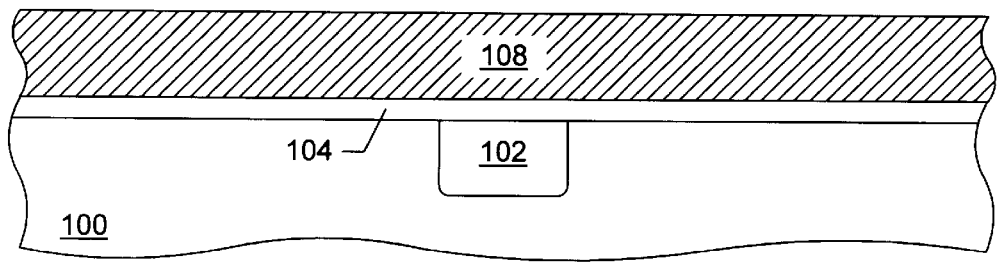
FIG. 18 is a cross-sectional view of the semiconductor topography, wherein a polysilicon layer is deposited across the gate oxide, subsequent to the step in FIG. 17.
Figure 19:
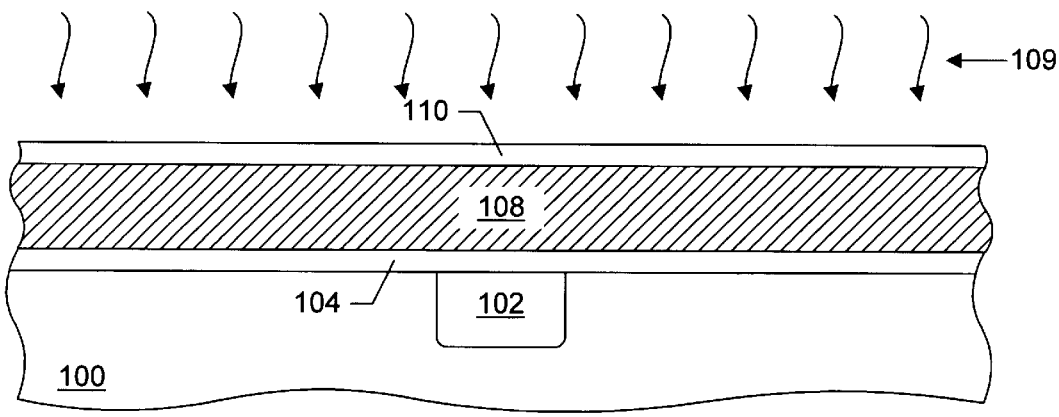
FIG. 19 is a cross-sectional view of the semiconductor topography, wherein an oxide layer is formed across the polysilicon layer, subsequent to the step in FIG. 18.
Figure 20:
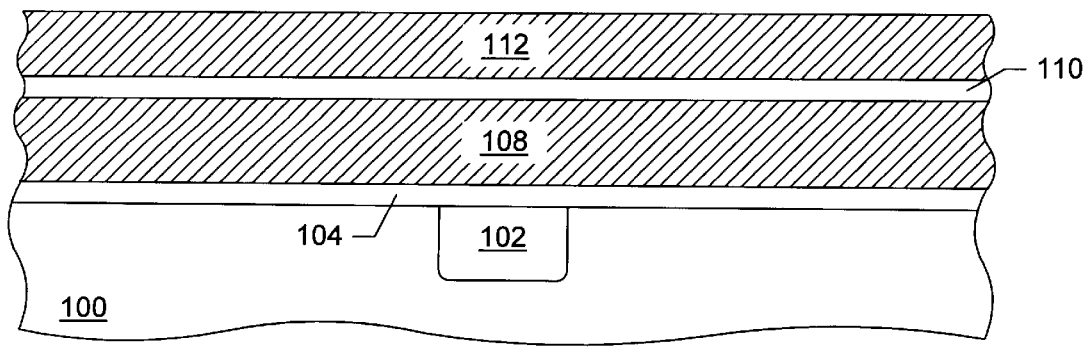
FIG. 20 is a cross-sectional view of the semiconductor topography, wherein a sacrificial layer is deposited across the oxide layer, subsequent to the step in FIG. 19.

FIGS. 17–27 depict another embodiment according to the present invention. Turning to FIG. 17, a partial view of a semiconductor topography is depicted, wherein a semiconductor substrate 100 is provided upon which a gate dielectric 104 is formed. Substrate 100 comprises single crystalline silicon and dielectric isolation regions, such as shallow trench isolation structure 102 for dielectrically isolating active areas of the substrate. The dielectric isolation regions may alternately include well known LOCOS structures. Gate dielectric 104 may be formed by subjecting silicon-based substrate 100 to thermal radiation 106 in an oxygen bearing ambient. As such, gate dielectric 104 may be composed of a thermally grown oxide. FIG. 18 depicts the deposition of a polysilicon layer 108 across gate dielectric 104. Polysilicon layer 108 may be CVD deposited from, e.g., a silane source. As illustrated in FIG. 19, polysilicon layer 108 may be exposed to thermal radiation 109 while in the presence of an oxygen bearing ambient. In this manner, a thermally grown oxide layer 110 is formed across polysilicon layer 108. Thereafter, a sacrificial layer 112 is formed across oxide layer 110. Sacrificial layer 112 preferably comprises, but is not limited to, polysilicon. Sacrificial layer 112 may alternately be composed of, e.g., metal or oxynitride.

Figure 21:
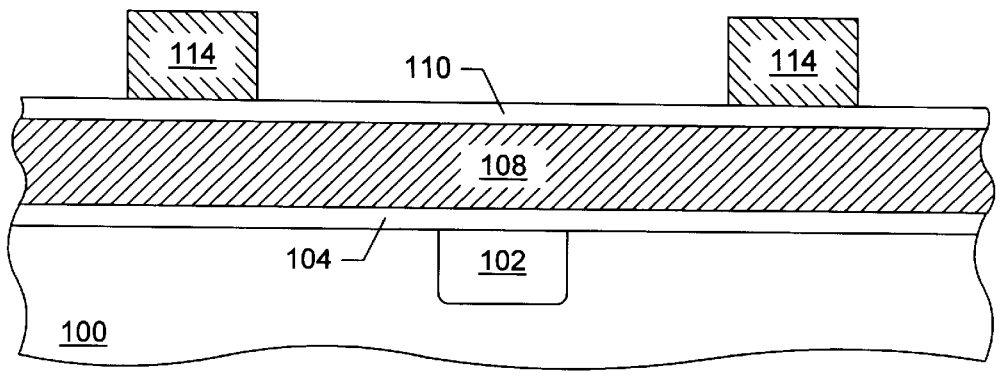
FIG. 21 is a cross-sectional view of the semiconductor topography, wherein portions of the sacrificial layer are removed to define opposed sidewall surfaces of sacrificial structures, subsequent to the step in FIG. 20.
Figure 22A:
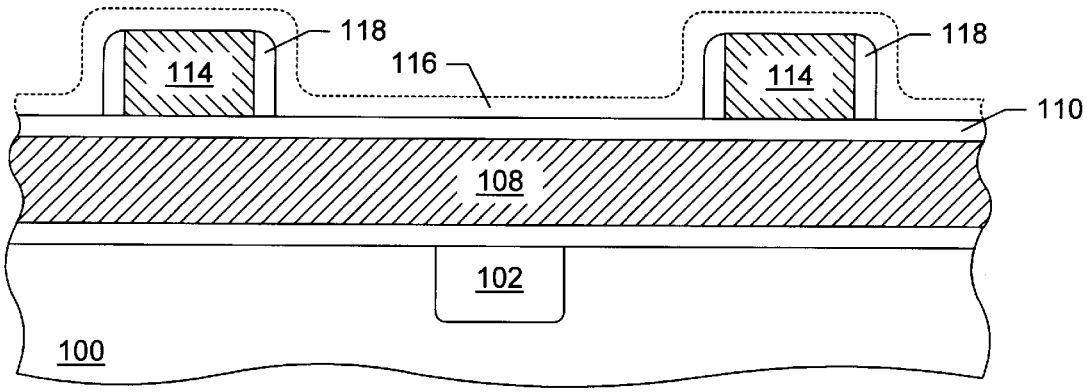
FIG. 22a is a cross-sectional view of the semiconductor topography, wherein sidewall spacers are formed upon the sidewall surfaces of the sacrificial structures, subsequent to the step in FIG. 21.
Figure 22B:
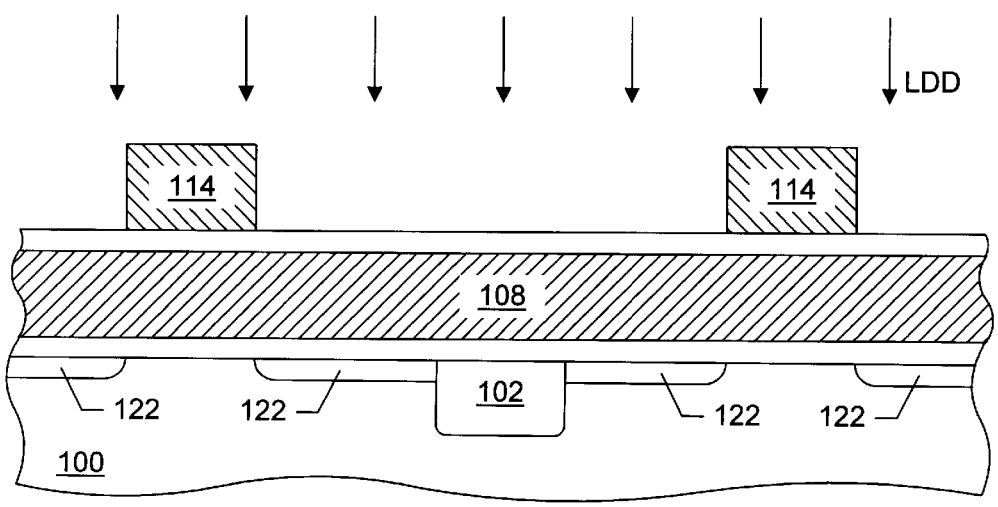
FIG. 22b is a cross-sectional view of the semiconductor topography, wherein an LDD implant self-aligned to the opposed sidewall surfaces of the sacrificial structures is performed, subsequent to the step in FIG. 21.

As shown in FIG. 21, portions of sacrificial layer 112 are removed to form sacrificial structures 114 upon oxide layer 110. FIG. 22a depicts the formation of sidewall spacers 118 upon opposed sidewall surfaces of sacrificial structures 114. Sidewall spacers 118 may be formed by depositing a spacer material 116 across exposed surfaces of oxide layer 110 and sacrificial structures 114, followed by anisotropically etching the spacer material. Ion ablation of spacer material 116 occurs more frequently upon horizontal surfaces than vertical surfaces. As such, spacer material 116 is etched from horizontally oriented surfaces while it is retained as spacers 118 upon the vertically oriented sidewall surfaces of sacrificial structures 114. Sidewall spacer 118 may be composed of, e.g., oxide, nitride, or oxynitride. Alternately, as shown in FIG. 22b, an LDD implant self-aligned to the opposed sidewall surfaces of sacrificial structures 114 may be performed to introduce a light concentration of dopant species into substrate 100. As a result, LDD areas 122 are formed within substrate 100. Isolation region 102 electrically isolates LDD areas 122 of different ensuing transistors.

Figure 23A:
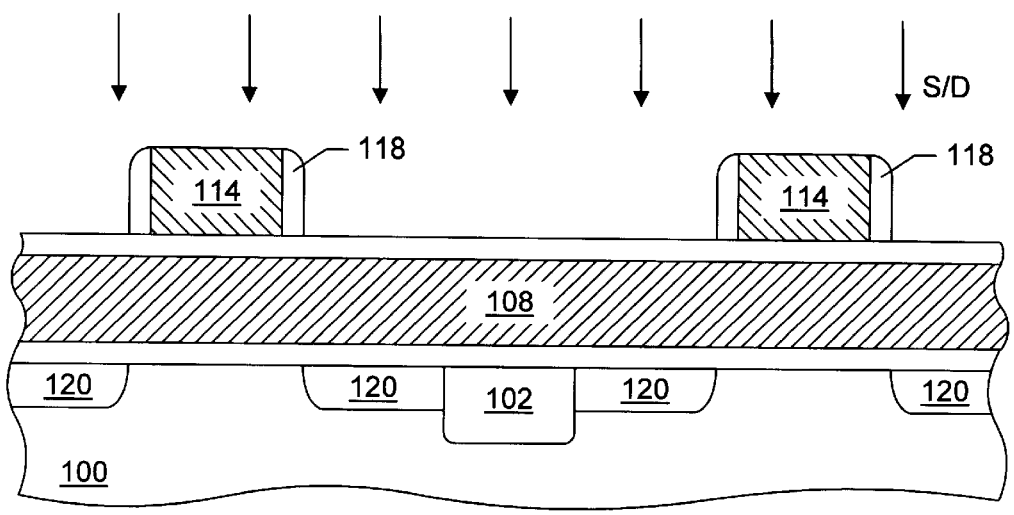
Figure 23B:
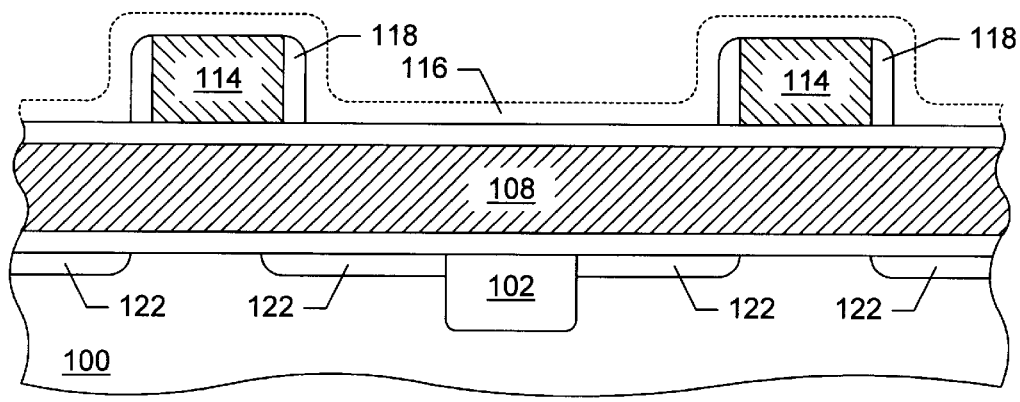
FIG. 23b is a cross-sectional view of the semiconductor topography, wherein sidewall spacers are formed upon the sidewall surfaces of the sacrificial structures, subsequent to the step in FIG. 22b.

FIG. 23a depicts a S/D implant self-aligned to the exposed lateral edges of sidewall spacers 118 being forwarded into substrate 100, subsequent to the step in FIG. 22a. In this manner, source/drain regions 120 having a relatively high concentration of dopant species are formed within substrate 100. Isolation region 102 serves to prevent electrical communication between source/drain regions 120 belonging to different ensuing transistors. As shown in FIG. 23b, sidewall spacers 118 may be formed upon opposed sidewall surfaces of sacrificial structures 114, subsequent to the step in FIG. 22b in the same manner as depicted in FIG. 22a.

Figure 24A:
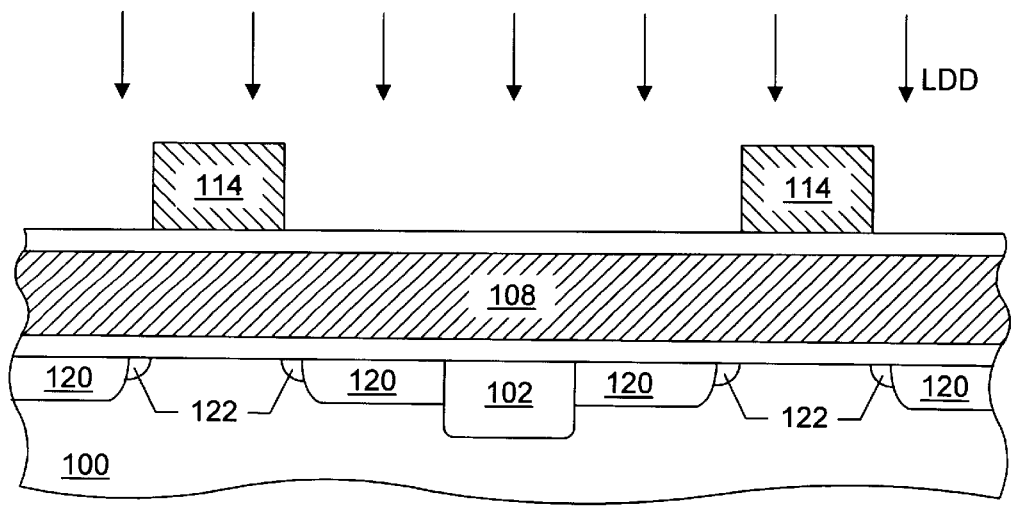
Figure 24B:
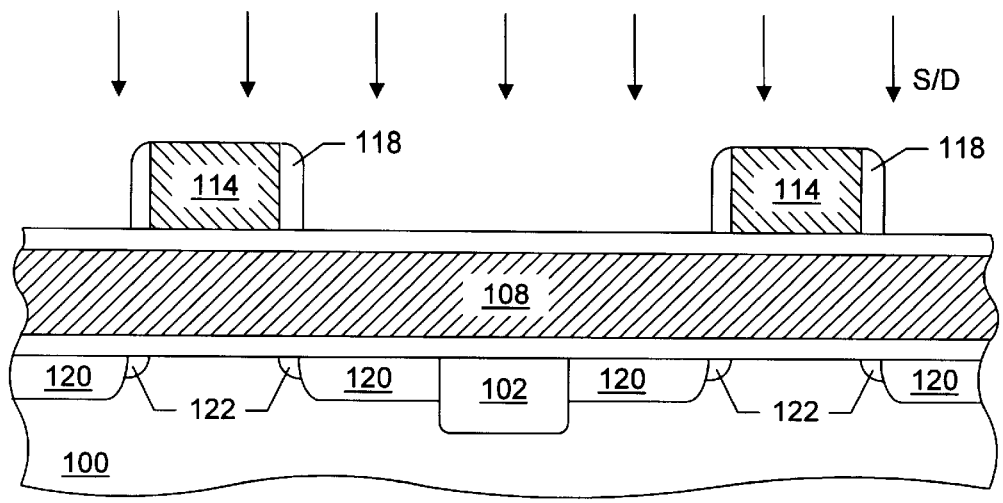
FIG. 24b is a cross-sectional view of the semiconductor topography, wherein a S/D implant self-aligned to the exposed lateral surfaces of the sidewall spacers is performed, subsequent to the step in FIG. 23b.
Figure 25:
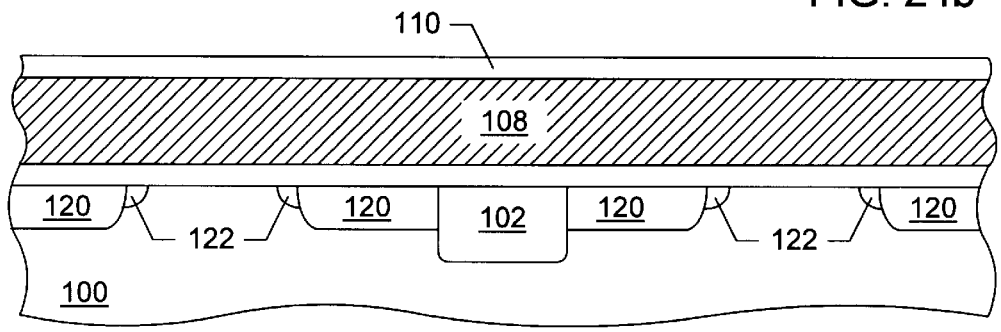
FIG. 25 is a cross-sectional view of the semiconductor topography, wherein the sacrificial structures and the sidewall spacers, if applicable, are removed from above the oxide layer, subsequent to the step in FIG. 24a or in FIG. 24b.

As shown in FIG. 24a, sidewall spacers 118 may be removed from the opposed sidewall surfaces of sacrificial structures 114, subsequent to the step in FIG. 23a. An LDD implant self-aligned to the exposed sidewall surfaces of sacrificial structures 114 may then be forwarded into substrate 100 at a lower dose and energy than the S/D implant depicted in FIG. 23a. As a result, LDD areas 122 are formed laterally adjacent to source/drain regions 120. FIG. 24b depicts a processing step to be performed subsequent to the step shown in FIG. 23b. A S/D implant self-aligned to the exposed lateral edges of sidewall spacers 118 is performed to form source/drain regions 120 within substrate 100. Sacrificial structures 114, and if present, sidewall spacers 118 are thereafter removed from the semiconductor topography depicted in FIGS. 24a and 24b. As shown in FIG. 25, the resulting semiconductor topography is the same whether formed by the sequence of steps depicted in FIGS. 22a–24a or the sequence of steps depicted in FIGS. 22b–24b. LDD areas 122 and source/drain regions 120 together form graded junctions which increase dopant concentration in a direction away from the adjacent gate conductor 124.

Figure 26:
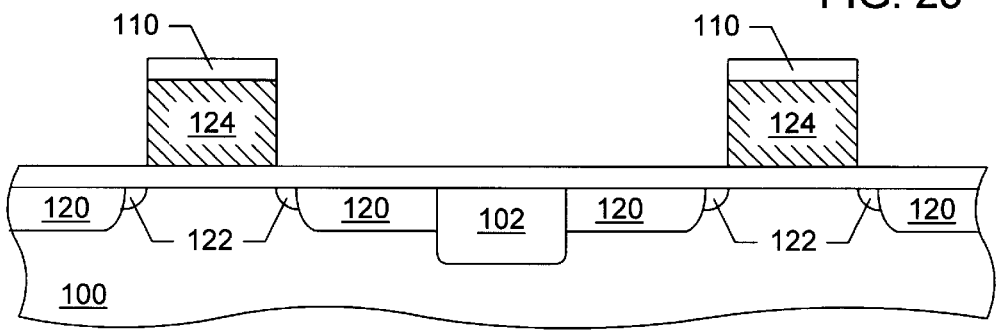
FIG. 26 is a cross-sectional view of the semiconductor topography, wherein portions of the oxide layer and polysilicon layer are removed to define gate conductors above which oxide is arranged, subsequent to the step in FIG. 25.
Figure 27:
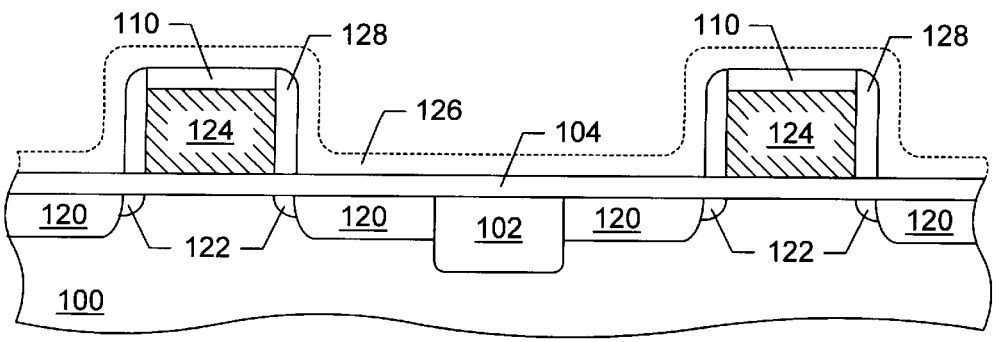
FIG. 27 is a cross-sectional view of the semiconductor topography, wherein sidewall spacers are formed upon opposed sidewall surfaces of the gate conductors, subsequent to the step in FIG. 26.

Turning to FIG. 26, portions of oxide layer 110 and polysilicon layer 108 are removed using optical lithography followed by an etch technique, e.g., a plasma etch. In this manner, doped polysilicon gate conductors 124 are formed above substrate 100 between LDD areas 122. Dopant species have been positioned within polysilicon layer 108 during the previous S/D implant. A post-implant anneal may have been performed after the S/D implant to activate and position the dopant species. The dopant species implanted into LDD areas 122, source/drain regions 120, and gate conductors 124 are opposite in type to the dopant species positioned in the channel regions of substrate 100 underneath gate conductors 124. As shown in FIG. 27, a dielectric spacer material 104, such as oxide or nitride may be deposited across the semiconductor topography. Portions of spacer material 104 may be removed using an anisotropic etch, thereby forming dielectric sidewall spacers 128 upon opposed sidewall surfaces of gate conductors 124. Alternately, sidewall spacers 128 may be thermally grown upon gate conductors 124. Oxide layer 110 and sidewall spacers 128 may serve to prevent the diffusion of dopant species in gate conductors 124 from migrating to other areas of the ensuing integrated circuit. Metal silicide contact regions may be formed upon source/drain regions 120 in subsequent processing steps. The sidewall surfaces of gate conductors 124 advantageously have not been exposed to ion bombardment during the transistor fabrication.

It will be appreciated to those skilled in the art having the benefit of this disclosure that this invention is believed to provide a method for forming transistors in which S/D implants and LDD implants are performed prior to defining the sidewall surfaces of gate conductors so as to prevent ion bombardment of those surfaces. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a transistor, comprising:
   providing a polysilicon layer dielectrically spaced above a semiconductor substrate;
   patterning a masking layer above a select portion of said polysilicon layer to define a first pair of opposed sidewalls of said masking layer spaced laterally apart by a first lateral distance;
   implanting a first impurity distribution in said substrate in which the implanting is self-aligned to said first pair of opposed sidewalls of said masking layer;
   etching said masking layer to define a second pair of opposed sidewalls of said masking layer spaced laterally apart by a second lateral distance;
   implanting a second impurity distribution into said substrate in which the implanting is self-aligned to said second pair of opposed sidewalls of said masking layer; and
   etching away portions of said polysilicon layer unmasked by said masking layer to form a gate conductor, subsequent to said implanting the second impurity distribution.

2. The method of claim 1, further comprising forming an oxide layer across said polysilicon layer and a nitride layer across said oxide layer prior to said patterning the masking layer upon said nitride layer.

3. The method of claim 1, wherein said masking layer is arranged directly upon said polysilicon layer.

4. The method of claim 1, further comprising forming a sacrificial material substantially dissimilar from said polysilicon layer across said polysilicon layer prior to said patterning the masking layer upon said sacrificial material.

5. The method of claim 1, wherein said masking layer comprises photoresist.

6. The method of claim 1, wherein said second lateral distance is substantially less than said first lateral distance.

7. The method of claim 1, wherein said first impurity distribution comprises a greater concentration of dopants than said second impurity distribution.

8. The method of claim 1, further comprising forming a pair of sidewall spacers upon opposed sidewall surfaces of said gate conductor.

* * * * *